United States Patent [19]
Isomichi et al.

[11] Patent Number: 4,990,857
[45] Date of Patent: Feb. 5, 1991

[54] INSULATION TESTING APPARATUS OF A REFRIGERATING MACHINE

[75] Inventors: Kanji Isomichi; Hiroshi Ogawa, both of Nagoya; Nobuhiro Funahashi; Toshio Yamashita, both of Aichi, all of Japan

[73] Assignee: Mitsubishi Juko Gyo k.k., Tokyo, Japan

[21] Appl. No.: 467,273

[22] Filed: Jan. 22, 1990

Related U.S. Application Data

[63] Continuation of Ser. No. 295,836, Jan. 11, 1990, abandoned.

[30] Foreign Application Priority Data

Jan. 18, 1988 [JP] Japan .................................. 63-7950

[51] Int. Cl.[5] .................................. G01R 31/12
[52] U.S. Cl. .................................. 324/551; 340/647; 324/511
[58] Field of Search ............... 324/510, 511, 522, 523, 324/551; 340/647, 648; 318/490

[56] References Cited

U.S. PATENT DOCUMENTS

| | | | |
|---|---|---|---|
| 3,886,409 | 5/1975 | Scarpino | 324/510 |
| 3,946,573 | 3/1976 | Nichols et al. | 324/511 |
| 3,986,107 | 10/1976 | Dickson et al. | 324/551 |
| 4,140,964 | 2/1979 | Eubank et al. | 324/551 |
| 4,540,922 | 9/1985 | Horvath et al. | 324/510 |

Primary Examiner—Reinhard J. Eisenzopf
Assistant Examiner—Maura K. Regan
Attorney, Agent, or Firm—Stanger, Michaelson, Spivak & Wallace

[57] ABSTRACT

In the self testing refrigerator disclosed, a controller normally controls the operation of various electrical devices, such as a compressor, a blower, and an electric heater by actuating and deactuating separate relays from the power source to each of the devices. During self testing, a switch arrangement disconnects the power source supply and substitutes a high voltage dc generator having a series resistor. The same controller that controls the refrigeration operation of the devices automatically actuates the aforementioned relays separately and successively to apply the high voltage across the terminals of the electric devices and ground. The voltage across the resistor indicates the current flow through, and hence the integrity of, the insulation in each of the devices.

8 Claims, 2 Drawing Sheets

INSULATION TESTING APPARATUS OF A REFRIGERATING MACHINE

This is a continuation of application Ser. No. 295,836 filed Jan. 11, 1990, now abandoned.

FIELD OF THE INVENTION AND RELATED ART STATEMENT

The present invention relates an insulation testing apparatus of a refrigerating machine such as a refrigerating container for marine transportation which is required to be subjected to an electric insulation test repeatedly in a short time.

For example, in a refrigerating machine (hereinafter referred to as a refrigerating unit) for a marine container which is one of apparatuses utilizing refrigeration, inspection is conducted for a refrigerating system thereof prior to loading of cargoes. This inspection diagnoses important elements of the refrigerating system in advance in order to transport the expensive loaded cargoes to a destination without hindrance under severe environment conditions. This operation is called PTI, that is, Pre-Trip Inspection.

In the PTI for the refrigerating container, a controller composed of a microcomputer performs the diagnosis of control functions, sensors, actuators, refrigerant systems, hydraulic systems and the like.

Another important PTI, performs an insulation test for electric devices. This insulation test in performed for each refrigerating unit by an operator. The PTI is performed for many (several hundreds) refrigerating units at a time prior to loading cargoes onto on a container ship at a wharf for the container and accordingly automation of the PTI using automatic diagnosis function is required.

FIG. 3 shows an example of a control circuit of a conventional refrigerating unit. In the insulation resistance test of the conventional refrigerating machine shown in FIG. 3, a no-fuse breaker 21 constituting a main switch is turned off to stop the operation of a controller 22 so that contacts 23a to 26a of electromagnetic switches 23 to 26 are opened. An insulation resistance of a compressor 28 is measured by bringing a positive pole 27a and a negative pole 27b of a contact maker of an insulation-resistance tester 27 into contact with a load connecting terminal of the electromagnetic switch 23 and an external casing (at the same potential as the grounded potential) of a motor 28 of the compressor. Insulation resistance of other electric devices mainly constituting the refrigerating machine such as, for example, blower 29, a motor 30 and a heater 31 are also measured in the same manner.

As described above, since the conventional insulation resistance test of the refrigerating machine is made using the insulation-resistance tester for each electric device by operator, it is troublesome and requires much time. Further, when many refrigerating units must be inspected, the insulation resistance test impedes reduction of operation time greatly.

OBJECT AND SUMMARY OF THE INVENTION

The present invention has been made in view of the above problem and an object of the present invention is to provide an insulation testing apparatus of a refrigerating machine which can solve the problem in the prior art.

In order to achieve the above object, the present invention is configured as follows.

The insulation testing apparatus of the refrigerating machine including electric devices mainly consisting of a compressor, a blower and an electric heater is characterized by the provision of means for generating a high dc voltage to which a series resistor is coupled, switching means for disconnecting each of said electric devices from a drive power supply thereof and applying said high voltage between a power connection terminal of each of said electric devices and ground through internal power lines in the refrigerating machine successively and separately and testing means for testing an insulation resistance of each of said electric devices in accordance with a current flowing between said power connection terminal and ground.

According to the present invention, a controller of the refrigerating machine has a function for separating external power lines and internal power lines within the apparatus and includes the high voltage generator identical with that of conventional insulation-resistance tester. The controller functions to apply an output of the high voltage generator between the internal power lines and ground and further successively opens and closes electromagnetic control switches to apply the high voltage to each of electric devices separately. The controller serves to detect a current flowing through the circuit applied with the high voltage and compare the detected current with a reference value so that insulation failure of each of the electric devices can be decided.

According to the present invention, the insulation resistance test in PTI which has heretofore required much time can be easily automatized and can be combined with self-diagnosis function of the controller to greatly reduce labor for the PTI.

DETAILED DESCRIPTION OF A PREFERRED EMBODIMENT

Figure 1:
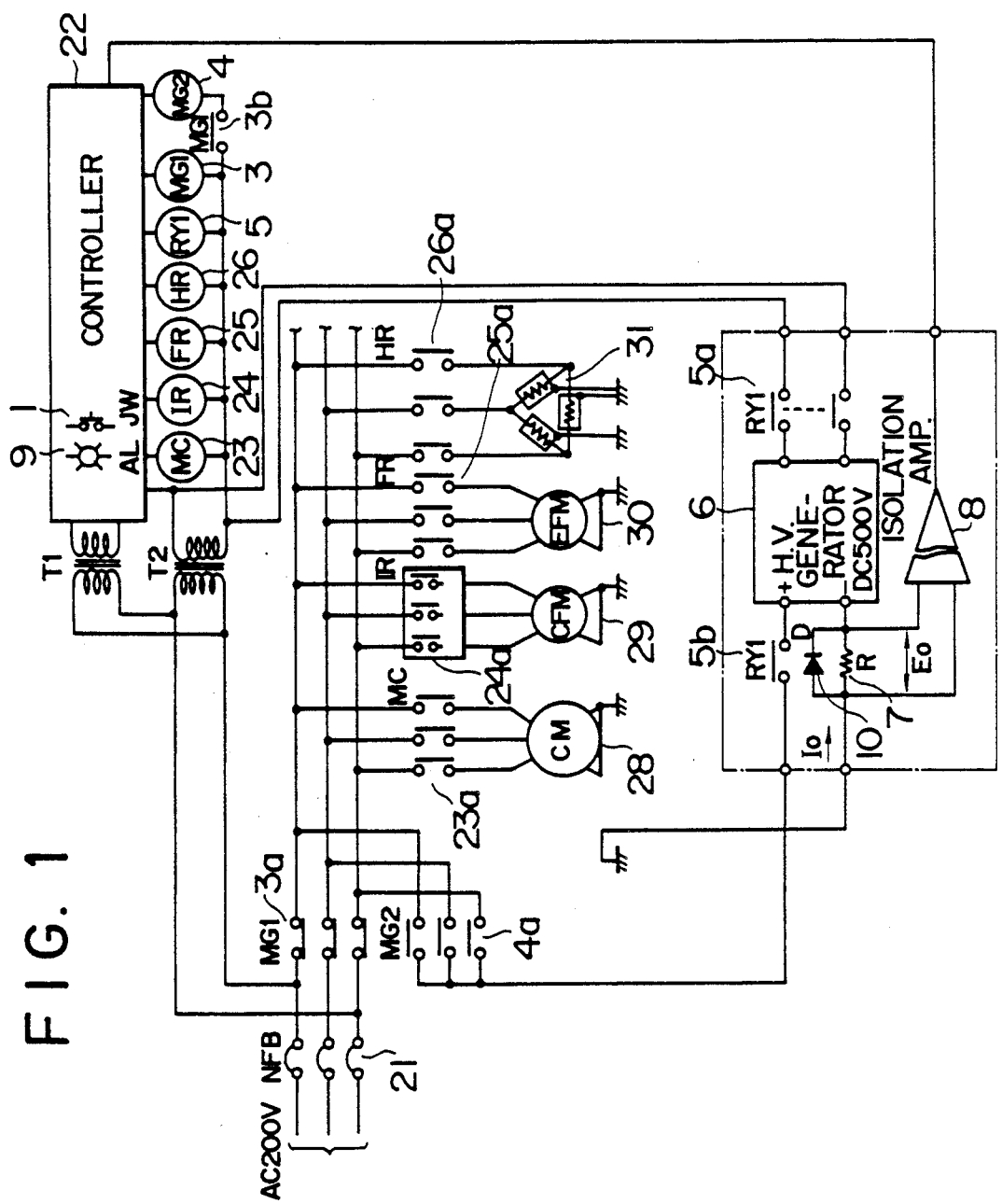
FIG. 1 is a circut diagram of a controller of a refrigerating unit having automatic insulation testing function.
Figure 2:
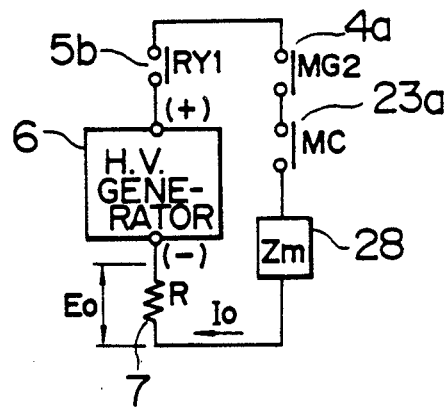
FIG. 2 is a circuit diagram of a closed loop for insulation test in FIG. 1.
Figure 3:
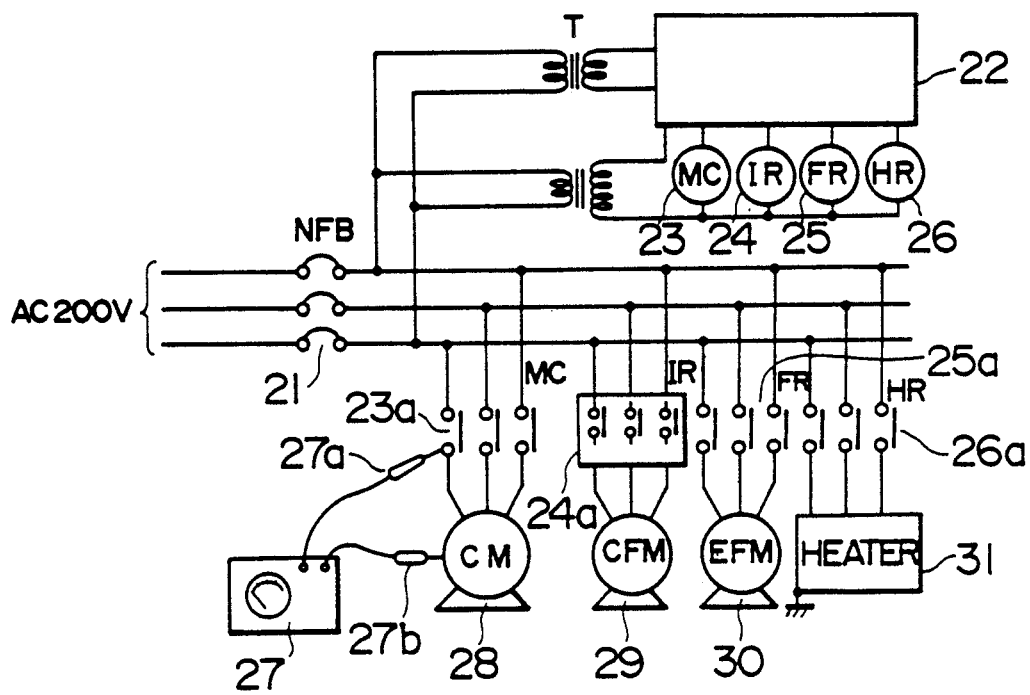
FIG. 3 is a circuit diagram of a controller of a conventional refrigerating unit.

FIG. 1 shows a configuration of an embodiment of the present invention and FIG. 2 shows a closed loop circuit for insulation test.

In FIG. 1, the present invention is applied to a refrigerating machine for a marine container. A no-fuse breaker 21 is closed to operate a controller 22, which controls control relays 23, 24, 25 and 26 for a compressor motor, a condenser fan, an evaporator fan and a heater, respectively, to thereby perform refrigerating operation. In FIG. 1, numeral 1 denotes a start switch for self-diagnosis. When the start switch 1 is depressed to be turned on, the controller 22 starts a self-diagnosis mode in which refrigerating operation is immediately stopped and a relay 3 for disconnecting an ac power source is operated so that its contacts 3a and 3b are opened and closed, respectively, and all other relays are turned off.

A relay 4 for short-circuiting an internal power supply circuit in the refrigerating unit is then operated to close contacts 4a thereof so that three lines for three phases which are internal power lines in the unit are short-circuited with each other.

The relay 4 can not be operated when the relay 3 is off. When an impedance of each of the three lines is low enough, the short circuit by the contacts 4a of the relay 4 is not required. Subsequently, a relay 5 for applying a high voltage is operated to close its contacts 5a and 5b at an input side and an output side, respectively, of a high dc voltage generator 6 to apply a high positive output voltage to an internal ac 200 voltage power line. A high negative output voltage is previously coupled to a housing (ground) of a container.

The compressor control relay 23 is now operated to close its contacts 23a. Consequently, a current Io flowing through the high voltage generator 6 flows through a current detection resistor (R) 7 and a voltage Eo generated across the resistor 7 is amplified by an isolation amplifier 8 to be applied to the controller 22. When an electric circuit between the container housing and the power connection terminal of the compressor motor 23 is normal, a resistance therebetween, that is, an insulation resistance is sufficiently high and the voltage Eo is sufficiently low. On the other hand, the insulation of the internal ac power line in the refrigerating unit is estimated on the basis of the voltage Eo before operation of the compressor motor control relay 23.

The output voltage of the high voltage generator 6 is normally 500 volts dc identical with that of the conventional insulation resistor tester.

The voltage α Eo (where α is the amplification of the isolation amplifier 8) applied to the controller 22 is compared with a reference value Em determined by the insulation resistance allowed by the compressor motor 23. A voltage α Eo larger than the reference Em, indicates that there is an insulation failure in the compressor motor 23 and an alarm indication lamp 9 is turned on.

When the controller has character indication function, a failed portion and an insulation resistance value are indicated.

Thus, the controller 22 can measure an insulation resistance of each of other electric devices successively in the same manner. For example, an insulation resistance of each of the condenser motor 29, the evaporator fan motor 30 and the heater 31 can be measured by operating the control relays 24, 25 and 26 separately.

A normal insulation resistance is 300 KΩ to 1 MΩ and thus the high voltage current Io is 1.6 mA to 0.5 mA.

Accordingly, the high voltage generator 6 may have a capacity of about 10 mA output at dc 500 volts. In a load including a semiconductor switch such as an inverter, it must be ensured that a withstand voltage of the switch is more than dc 500 volts.

A diode 10 is connected across the resistor 7 to prevent the isolation amplifier 8 from an excessive current when the insulation resistance is extremely low.

While the contacts 3a of the ac power disconnection relay (MG1) 3 are normally closed in the embodiment described above, normally opened contacts may be used to effect the same operation.

What we claim:

1. A self testing refrigeration machine, comprising:
   a plurality of electrical devices including a compressor device, a blower device, and a resistor type electric heater device;
   each of said devices including a power connecting terminal and a frame as well as insulation;
   an internal power line for connecting said terminals to an electric drive source;
   a plurality of control relays each having a contact connecting each of said power terminals to said internal power line;
   a device actuating controller for operating said control relays to affect operation of said electrical devices;
   a self-diagnosis switch in said controller;
   means for separating said internal power line from said electric drive source in response to said self diagnosis switch;
   a test voltage generator connected to said frames and having a high DC voltage source and a series resistor connected in series with said high DC voltage source;
   means for forming a plurality of closed loop circuits and including said series resistor, said internal power line, said contact of one of the electrical devices, and the frame of one of said electrical devices;
   means for applying a high DC voltage source to said closed loop circuits from said high DC voltage generating means; and
   testing means is said controller for energizing each of said control relays in turn so as to apply a high DC voltage to each of said electrical devices in turn through the contact of one of said control relays and for measuring the voltages thus generated across said series resistor by electric currents produced by said high voltage, so as to test the insulation of each of said electrical devices.

2. A self testing refrigeration machine as in claim 1, wherein said testing means includes a comparator for comparing a measured voltage and a standard voltage by the insulation resistance permitted by each of said electrical devices so as to establish a satisfactory or unsatisfactory condition of said insulation.

3. A self testing refrigeration machine as in claim 2, wherein said testing means includes indicating means for indicating an unsatifactory condition of insulation of each of said electrical devices when it is tested.

4. A self testing refrigerating machine as in claim 1, wherein each of said devices includes a plurality of power connecting terminals and said plurality of relays includes a set of relays for each plurality of terminals, said device actuating controller turning said set on and off separately for other sets.

5. A machine as in claim 1, wherein said test voltage generator is connected to said frames separately from said internal power line.

6. A machine as in claim 1, wherein said voltage generator includes means for connecting said voltage generator to said frames independently of said internal power line.

7. A machine as in claim 1, wherein said means for separating said internal power line from said electric drive source includes switch means separate from said contacts of said control relays for disconnecting the power line and all of said devices from the electric drive source while said testing means energizes each of said control relays in turn through said separated power line.

8. A machine as in claim 7, wherein said voltage generator includes means for connecting said voltage generator to said frames independently of said internal power line.

* * * * *